United States Patent
Wang et al.

(10) Patent No.: US 9,022,204 B2
(45) Date of Patent: May 5, 2015

(54) MANUFACTURING SYSTEM AND MANUFACTURING METHOD

(71) Applicant: Wistron Corporation, New Taipei (TW)

(72) Inventors: Chun-Kai Wang, New Taipei (TW); Hsueh-Yen Lai, New Taipei (TW); Xin-Hua Wang, New Taipei (TW)

(73) Assignee: Wistron Corporation, New Taipei (TW)

( * ) Notice: Subject to any disclaimer, the term of this patent is extended or adjusted under 35 U.S.C. 154(b) by 1 day.

(21) Appl. No.: 14/059,470

(22) Filed: Oct. 22, 2013

(65) Prior Publication Data

US 2014/0311857 A1    Oct. 23, 2014

(30) Foreign Application Priority Data

Apr. 23, 2013   (CN) .......................... 2013 1 0143849

(51) Int. Cl.
*B65G 47/26* (2006.01)
*B65G 47/64* (2006.01)

(52) U.S. Cl.
CPC .................................... *B65G 47/643* (2013.01)

(58) Field of Classification Search
CPC ............. B65G 47/643; B65G 2207/14; B65G 47/5145; B65G 1/127
USPC .......................................... 198/435, 456, 580
See application file for complete search history.

(56) References Cited

U.S. PATENT DOCUMENTS

| | | | | |
|---|---|---|---|---|
| 3,403,799 A | * | 10/1968 | Sindzinski et al. ........... | 198/435 |
| 4,867,299 A | * | 9/1989 | Fukuoka et al. ............. | 198/435 |
| 5,465,827 A | * | 11/1995 | Nakagawa et al. .......... | 198/580 |
| 6,394,257 B1 | * | 5/2002 | Wheeler .................... | 198/369.6 |
| 6,561,338 B2 | * | 5/2003 | Ito et al. .................. | 198/341.05 |
| 7,699,158 B2 | * | 4/2010 | Aust et al. ................ | 198/435 |
| 8,528,717 B2 | * | 9/2013 | Ando et al. ................ | 198/580 |
| 2003/0168313 A1 | * | 9/2003 | Hiroki ..................... | 198/369.6 |

FOREIGN PATENT DOCUMENTS

| | | |
|---|---|---|
| CN | 101594030 | 12/2009 |
| CN | 202062209 | 12/2011 |
| CN | 202447870 | 9/2012 |

* cited by examiner

*Primary Examiner* — James R Bidwell
(74) *Attorney, Agent, or Firm* — Jianq Chyun IP Office

(57) ABSTRACT

A manufacturing system includes a first conveyer apparatus, a second conveyer apparatus and a manufacturing apparatus. The first conveyer apparatus has a first conveyer unit and a first elevator unit. The first elevator unit is adapted to drive the first conveyer unit to move upward or downward between first and second positions. The second conveyer apparatus has a second conveyer unit and a second elevator unit. The second elevator unit is adapted to drive the second conveyer unit to move upward or downward between third and fourth positions. The manufacturing apparatus disposed between the first and second conveyer apparatuses has a manufacturing unit, a third conveyer unit and a fourth conveyer unit. A conveying path of the third conveyer unit passes through the manufacturing unit. The first and third positions are aligned to the third conveyer unit. The second and fourth positions are aligned to the third conveyer unit.

16 Claims, 12 Drawing Sheets

MANUFACTURING SYSTEM AND MANUFACTURING METHOD

CROSS-REFERENCE TO RELATED APPLICATION

This application claims the priority benefit of China application serial no. 201310143849.X, filed on Apr. 23, 2013. The entirety of the above-mentioned patent application is hereby incorporated by reference herein and made a part of this specification.

BACKGROUND

1. Field of the Application

The invention is directed to a manufacturing system and a manufacturing method, and more particularly, to a manufacturing system having conveying units and a manufacturing method thereof

2. Description of Related Art

Advancement of semiconductor devices and display technology leads to continuous development of electronic devices towards compactness, capabilities for performing multiple functions, and portability. Common portable electronic devices include tablet PCs, smart phones, notebook computers, and so forth. The aforementioned portable electronic devices with thin-form appearances thereof are quite suitable for users to carry and operate, and thus have gradually been accepted by the general public.

As such, various portable electronic devices have to be produced in a great amount for supplying the needs of the consumer market, and production efficiency of production line and control of production costs are also becoming important. Specifically, most electronic devices, during the production process, have to perform manufacturing and assembly to a variety of components via screw locking method, and a practice of traditional manufacturing production line, for example, is to use workpiece carriers to carry workpieces and uses conveyor belts to sequentially convey the workpiece carriers to a plurality of screw locking stations, so that operators at these screw locking stations, can sequentially perform different types of screw locking to the workpieces. However, in the operation process of the traditional manufacturing production line, it requires the operators to constantly and manually recover the workpiece carriers arrived at an end point of the production line, and requires the operators to constantly and manually provide the workpiece carriers to a starting point of the production line, so that the operation process can be continued. This is not only being labor-intensive, but also requires a much larger quantity for the workpiece carriers, and thus is unable to effectively enhance production efficiency and reduce production costs.

SUMMARY OF THE APPLICATION

The invention provides a manufacturing system and a manufacturing method with favorable production efficiency and capability of reducing production costs.

The manufacturing system of the invention includes a first conveyer apparatus, a second conveyer apparatus and at least one manufacturing apparatus. The first conveyer apparatus has a first conveyer unit and a first elevator unit. The first elevator unit is adapted to drive the first conveyer unit to move upward or downward between first position and a second position. The second conveyer apparatus has a second conveyer unit and a second elevator unit. The second elevator unit is adapted to drive the second conveyer unit to move upward or downward between a third position and a fourth position. The manufacturing apparatus is disposed between the first conveyer apparatus and the second conveyer apparatus and has a manufacturing unit, a third conveyer unit and a fourth conveyer unit. A conveying path of the third conveyer unit passes through the manufacturing unit. The first position and the third position are aligned to the third conveyer unit. The second position and the fourth position are aligned to the fourth conveyer unit. When the first conveyer unit is located at the first position, the first conveyer unit may be adapted to convey a workpiece carrier to the third conveyer unit. When the second conveyer unit is located at the third position, the third conveyer unit may be adapted to convey the workpiece carrier to the second conveyer unit. When the second conveyer unit is located at the fourth position, the second conveyer unit may be adapted to convey the workpiece carrier to the fourth conveyer unit. When the first conveyer unit is located at the second position, the fourth conveyer unit may be adapted to convey the workpiece carrier to the first conveyer unit.

The manufacturing method of the invention includes the following steps. A manufacturing system is provided, wherein the manufacturing system includes a first conveyer apparatus, a second conveyer apparatus and at least one manufacturing apparatus, the manufacturing apparatus is disposed between the first conveyer apparatus and the second conveyer apparatus and adjacent to the first conveyer apparatus and the second conveyer apparatus, the first conveyer apparatus has a first conveyer unit, a second conveyer apparatus has a second conveyer unit, and a manufacturing apparatus has a manufacturing unit, a third conveyer unit and a fourth conveyer unit. A workpiece carrier is disposed on the first conveyer unit, and a workpiece is disposed on the workpiece carrier. The first conveyer unit is driven to convey the workpiece carrier and the workpiece to the third conveyer unit. When the workpiece carrier and the workpiece are located on the third conveyer unit, the workpiece is manufactured. After the workpiece is manufactured, the third conveyer unit is driven to convey the workpiece carrier and the workpiece to the second conveyer unit. When the workpiece carrier and the workpiece are located on the second conveyer unit, the workpiece is moved away from the workpiece carrier. After the workpiece is moved away from the workpiece carrier, the second conveyer unit is driven to convey the workpiece carrier to the fourth conveyer unit. The fourth conveyer unit is driven to convey the workpiece carrier to the first conveyer unit.

According to the foregoing, in the invention, the manufacturing apparatus is disposed between the first conveyer apparatus and the second conveyer apparatus, the first conveyer apparatus has the first elevator unit adapted to drive the first conveyer unit, and the second conveyer apparatus has the second elevator unit adapted to drive the second conveyer unit. With this, the first conveyer unit, the second conveyer unit, the third conveyer unit and the fourth conveyer unit may constitute a looping conveying path, so that the workpiece carrier arrived at the ending point (viz., the second conveyer unit of the second conveyer apparatus) of a production line can automatically be sent back to the starting point (viz., the first conveyer unit of the first conveyer apparatus) of the production line through the fourth conveyer unit of the manufacturing apparatus. As a result, a user can enable the operation process to be continued without having to manually recover the workpiece carrier arrived at the ending point of the production line and manually provide the workpiece carrier to the starting point of the production line, such that manpower in need on the production line may be saved and thereby increases production efficiency. In addition, since the workpiece carrier may constantly be looping in the production line, a quantity of the workpiece carrier in demand may also be reduced, thereby lowering the production costs.

In order to make the aforementioned and other features and advantages of the present application more comprehensible, several embodiments accompanied with figures are described in detail below.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

DETAILED DESCRIPTION OF DISCLOSED EMBODIMENTS

Figure 1:
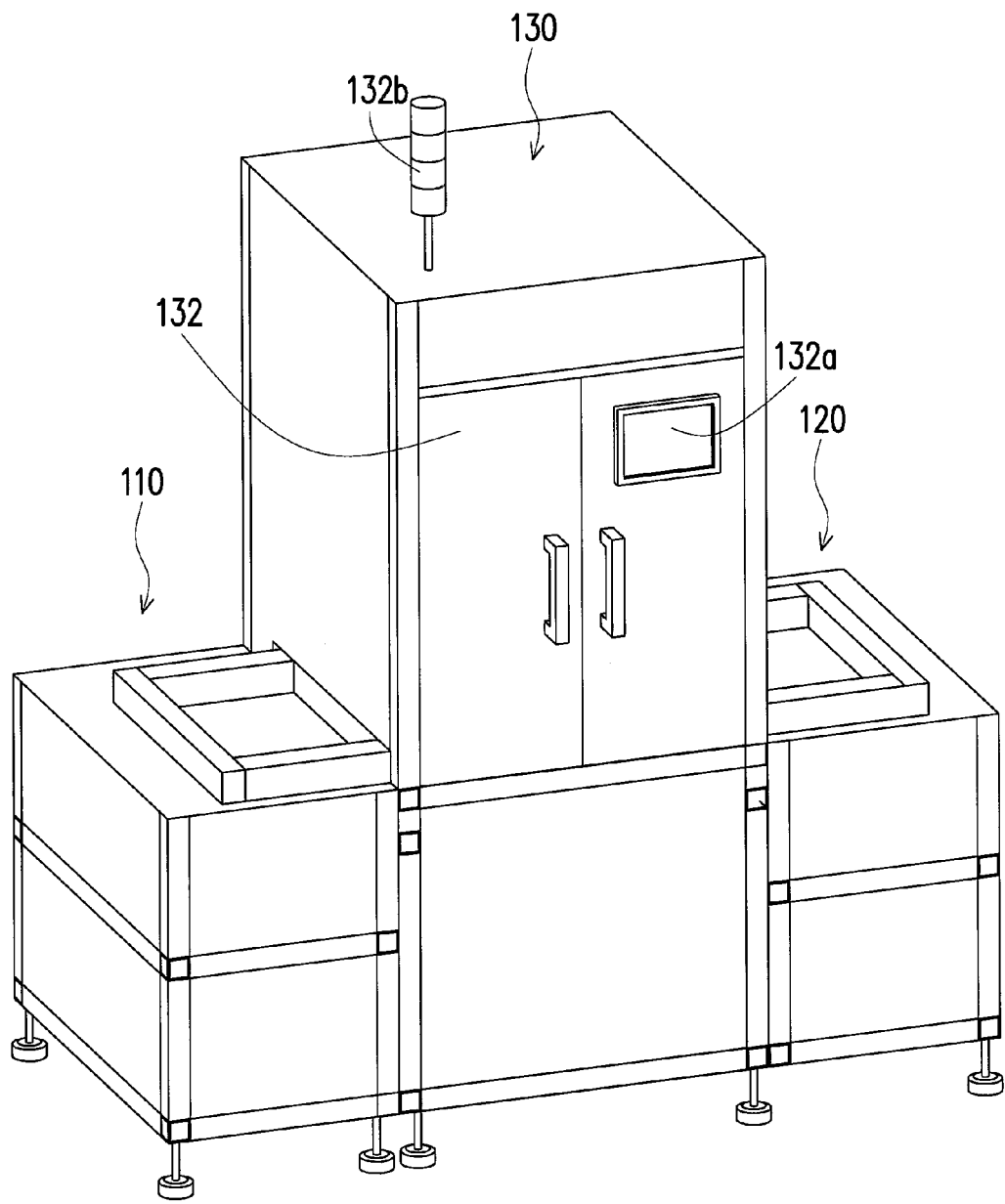
FIG. 1 is a perspective diagram illustrating a manufacturing system according to an embodiment of the invention.
Figure 2:
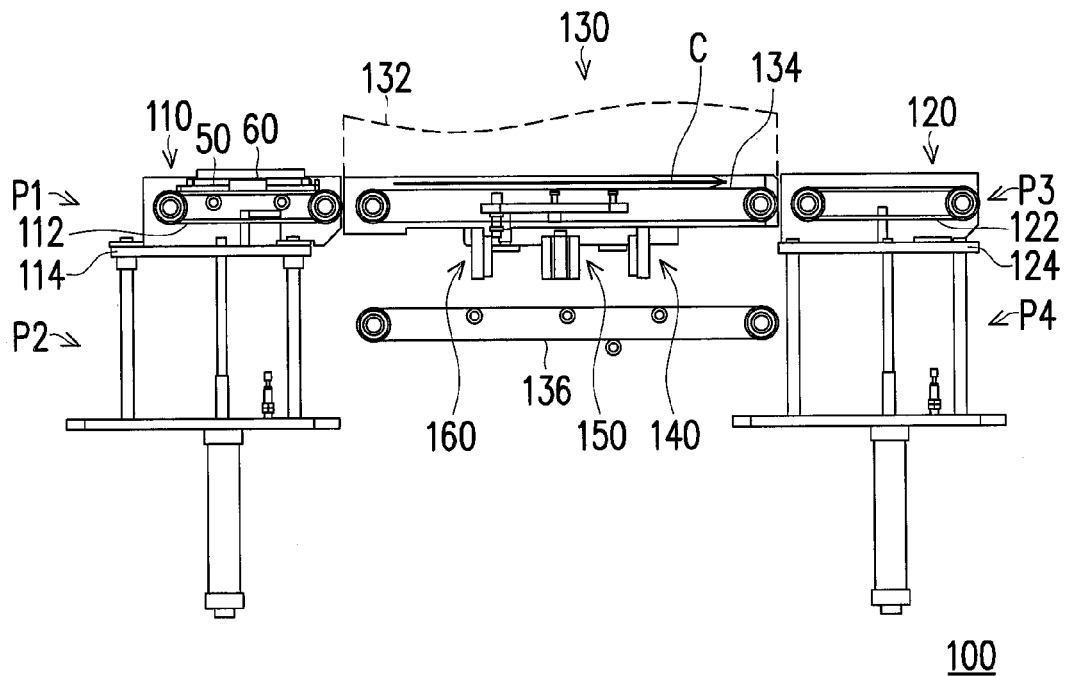
FIG. 2 is a schematic diagram illustrating partial components of the manufacturing system of FIG. 1.

FIG. 1 is a perspective diagram illustrating a manufacturing system according to an embodiment of the invention. FIG. 2 is a schematic diagram illustrating partial components of the manufacturing system of FIG. 1. Referring to FIG. 1 and FIG. 2, the manufacturing system 100 of the present embodiment includes a first conveyer apparatus 110, a second conveyer apparatus 120 and at least one manufacturing apparatus 130 (illustrated as one), wherein the manufacturing apparatus 130 is disposed between the first conveyer apparatus 110 and the second conveyer apparatus 120 and respectively adjacent to the first conveyer apparatus 110 and the second conveyer apparatus 120. The first conveyer apparatus 110 has a first conveyer unit 112 and a first elevator unit 114, and the first elevator unit 114 is adapted to drive the first conveyer unit 112 to move upward or downward between a first position P1 and a second position P2 (FIG. 2 illustrates the first conveyer unit 112 being located at the first position P1). The second conveyer apparatus 120 has a second conveyer unit 122 and a second elevator unit 124, and the second elevator unit 124 is adapted to drive the second conveyer unit 122 to move upward or downward between a third position P3 and a fourth position P4 (FIG. 2 illustrates the second conveyer unit 122 being located at the third position P3). In the present embodiment, the first elevator unit 114 and the second elevator unit 124, for example, are driven by a cylinder. In other embodiments, the first elevator unit 114 and the second elevator unit 124 may be driven by other proper methods, and the invention is not limited thereto.

The manufacturing apparatus 130 is disposed between the first conveyer apparatus 110 and the second conveyer apparatus 120 and has a manufacturing unit 132, a third conveyer unit 134 and a fourth conveyer unit 136, wherein the third conveyer unit 134 and the fourth conveyer unit 136 are substantially spaced apart in parallel. As shown in FIG. 2, a conveying path C of the third conveyer unit 134 passes through the manufacturing unit 132. The first position P1 and the third position P3 are aligned to the third conveyer unit 134, and the second position P2 and the fourth position P4 are aligned to the fourth conveyer unit 136. In the present embodiment, the first conveyer unit 112, the second conveyer unit 122, the third conveyer unit 134 and the fourth conveyer unit 136, for example, are conveyer belts. In addition, the manufacturing unit 132 of the present embodiment, for example, is an automatic screw machine, but the invention is not limited thereto; in the other embodiments, the manufacturing unit 132 may be other type of automation machine or manual operation platform. Accompanied with drawings, an operation process of the manufacturing system 100 of the present embodiment is described in detail below.

Figure 3A:
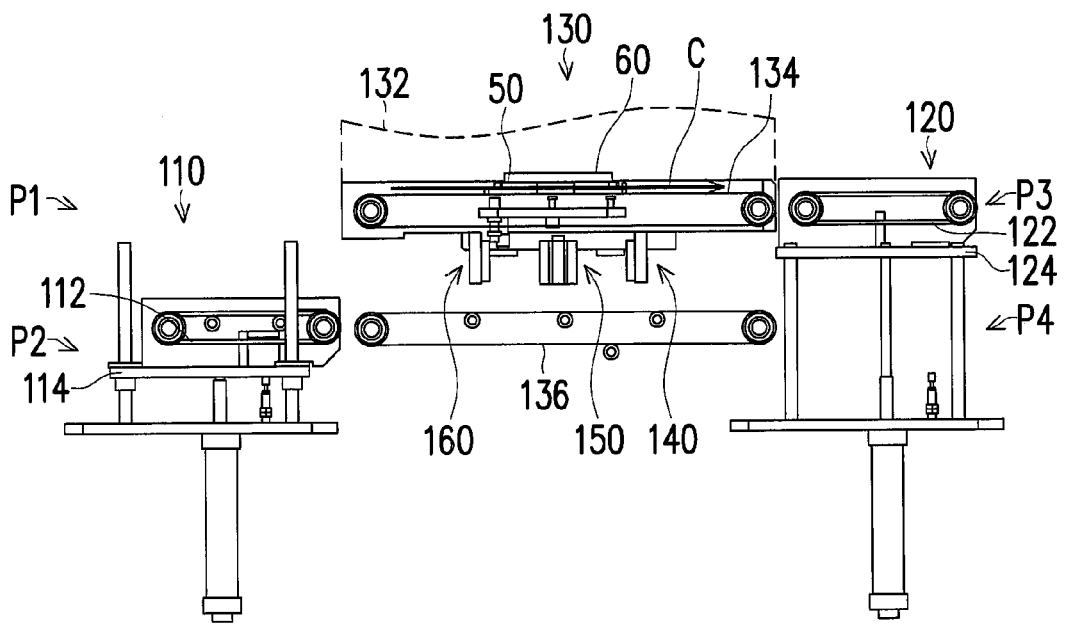
FIG. 3A to FIG. 3H illustrate an operation process of the manufacturing system of FIG. 2.
Figure 3B:
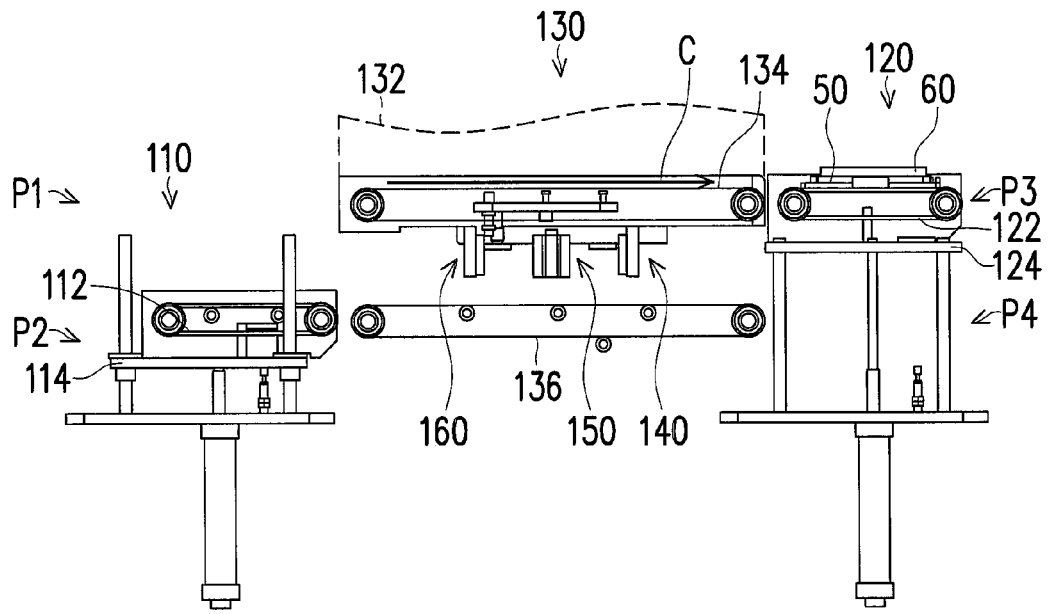

FIG. 3A to FIG. 3H illustrate the operation process of the manufacturing system of FIG. 2. FIG. 4 is a flow chart illustrating a manufacturing method of the manufacturing system of FIG. 2. Referring to FIG. 4, the manufacturing method of the manufacturing system 100 of the present embodiment includes the following steps. Firstly, the manufacturing system 100 is provided, as shown in FIG. 2, wherein the manufacturing system 100 includes the first conveyer apparatus 110, the second conveyer apparatus 120 and the at least one manufacturing apparatus 130, the first conveyer apparatus 110 has the first conveyer unit 112, the second conveyer apparatus 120 has the second conveyer unit 122, and the manufacturing apparatus 130 has the manufacturing unit 132, the third conveyer unit 134 and the fourth conveyer unit 136 (step S602). A workpiece carrier 50, as shown in FIG. 2, is disposed on the first conveyer unit 112, and a workpiece 60 is disposed on the workpiece carrier 50 (step S604), wherein the workpiece 60, for example, is a semi-finished electronic product.

Next, the first conveyer unit 112 is driven to convey the workpiece carrier 50 and the workpiece 60 to the third conveyer unit 134 (step S606). After the workpiece carrier 50 and the workpiece 60 are conveyed to the third conveyer unit 134, the first elevator unit 114 then drives the first conveyer unit 112 to drop from the first position P1 depicted by FIG. 2 to the second position P2 depicted by FIG. 3A; now, the first conveyer unit 112 is aligned to the fourth conveyer unit 136, and thus may be waiting to receive the workpiece carrier coming from the fourth conveyer unit 136. When the workpiece carrier 50 and the workpiece 60 are located on the third conveyer unit 134, the manufacturing unit 132 is driven to manufacture the workpiece 60 (step S608). After the manufacturing unit 132 has manufactured the workpiece 60, the third conveyer unit 134, as shown in FIG. 3B, is driven to convey the workpiece carrier 50 and the workpiece 60 to the second conveyer unit 122 (step S610).

Figure 3C:
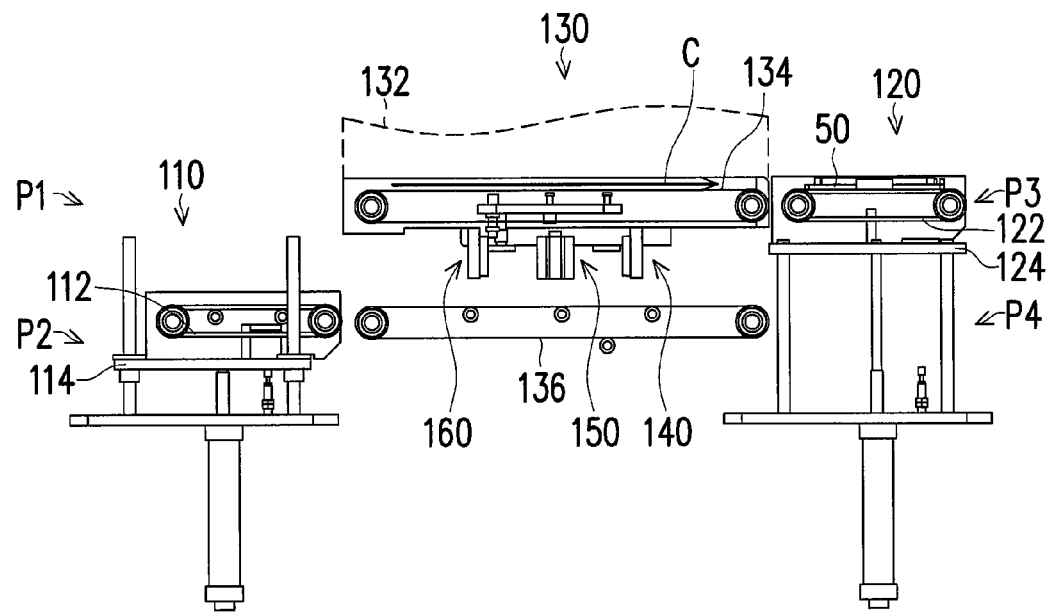
Figure 3D:
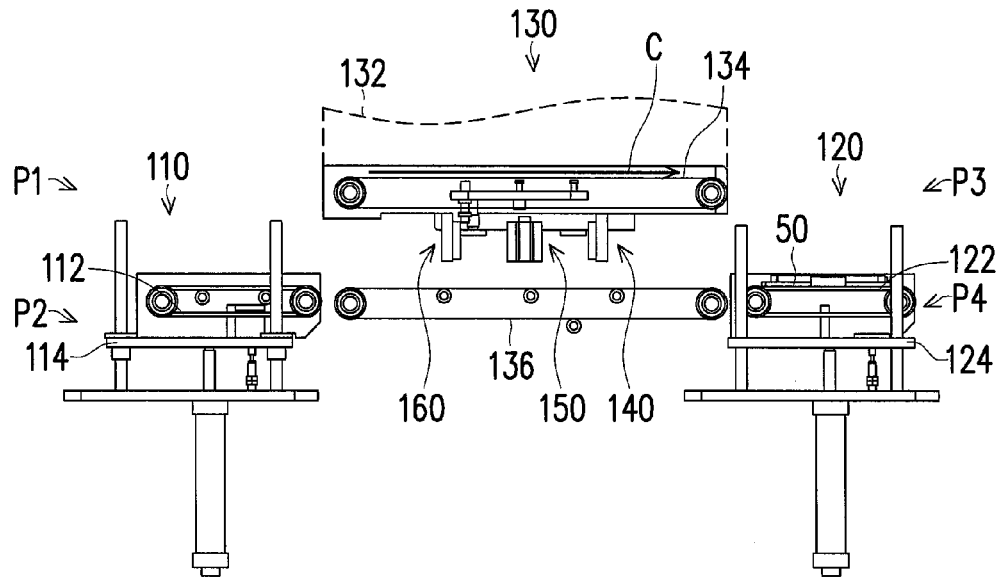
Figure 3E:
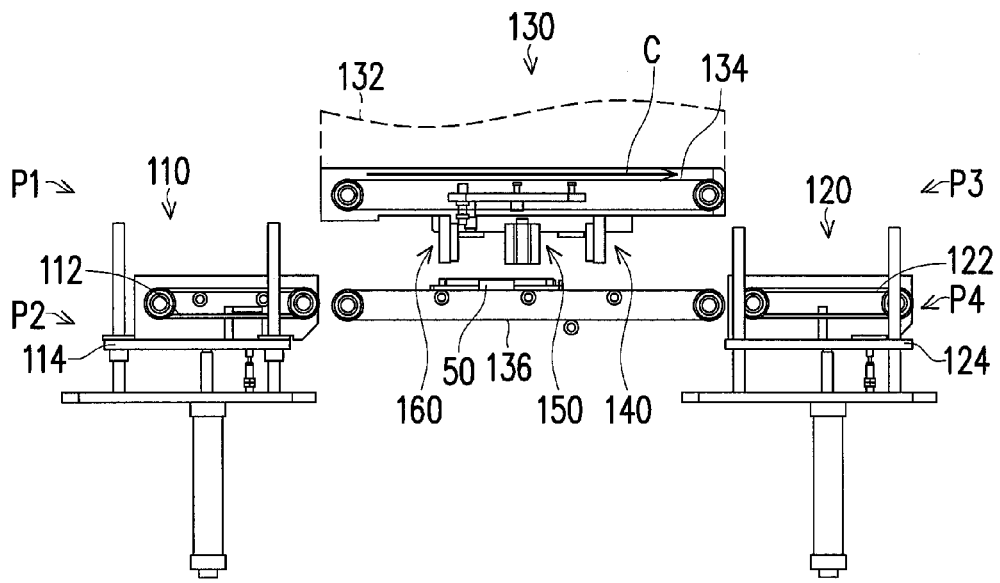

When the workpiece carrier 50 and the workpiece 60 are located on the second conveyer unit 122, the workpiece 60, as shown in FIG. 3C, is moved away from the workpiece carrier 50 (step S612). After the workpiece 60 is moved away from the workpiece carrier 50, the second conveyer unit 122, as shown in FIG. 3D to 3E, is driven to convey the workpiece carrier 50 to the fourth conveyer unit 136 (step S614), wherein the second elevator unit 124, for example, drives the second conveyer unit 122 to drop from the third position P3 depicted by FIG. 3C to the fourth position P4 depicted by FIG. 3D; now, the second conveyer unit 122 is aligned to the fourth conveyer unit 136, so that the second conveyer unit 122 can convey the workpiece carrier 50 to fourth conveyer unit 136, as shown in FIG. 3E. In addition, after the workpiece carrier 50 is conveyed to the fourth conveyer unit 136, the second elevator unit 124 then drives the second conveyer unit 122 to rise from the fourth position P4 depicted by FIG. 3E to the third position P3 depicted by FIG. 3F; now, the second conveyer unit 122 is aligned to the third conveyer unit 134, and thus may be waiting to receive the workpiece carrier coming from the third conveyer unit 134.

Figure 3F:
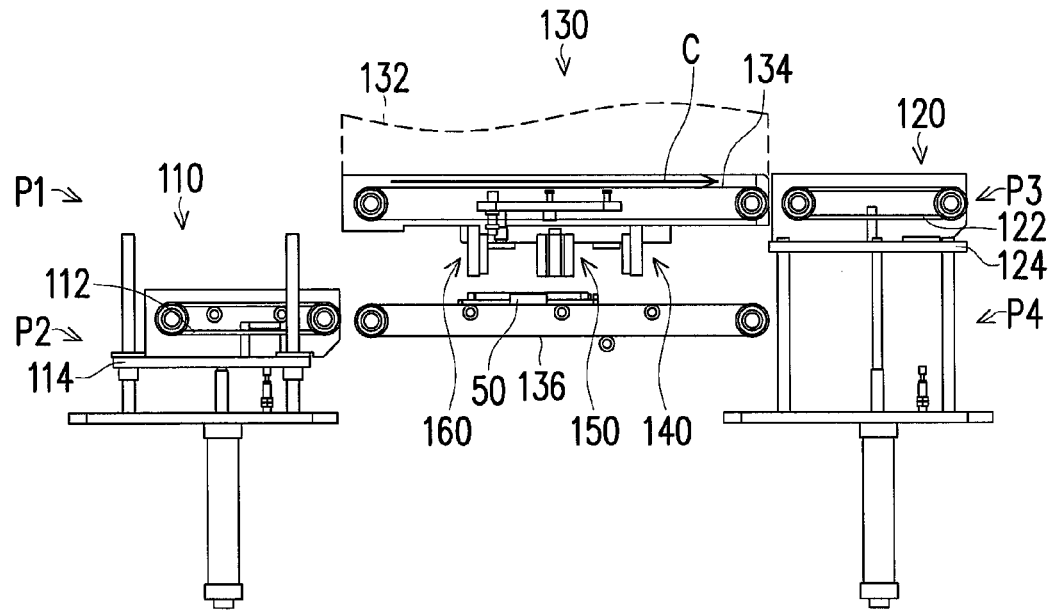
Figure 3G:
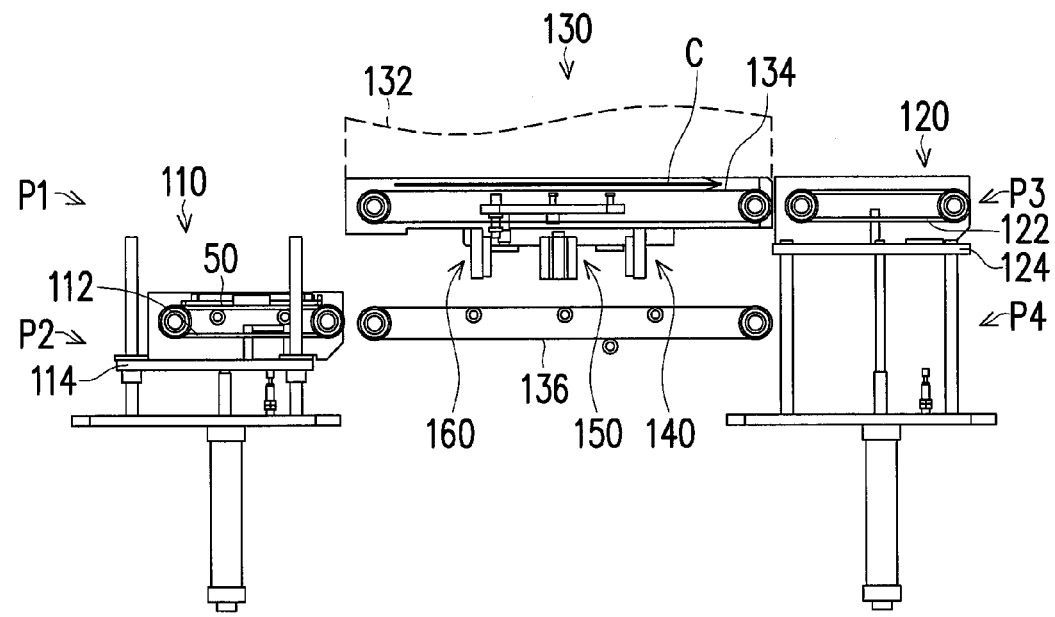
Figure 3H:
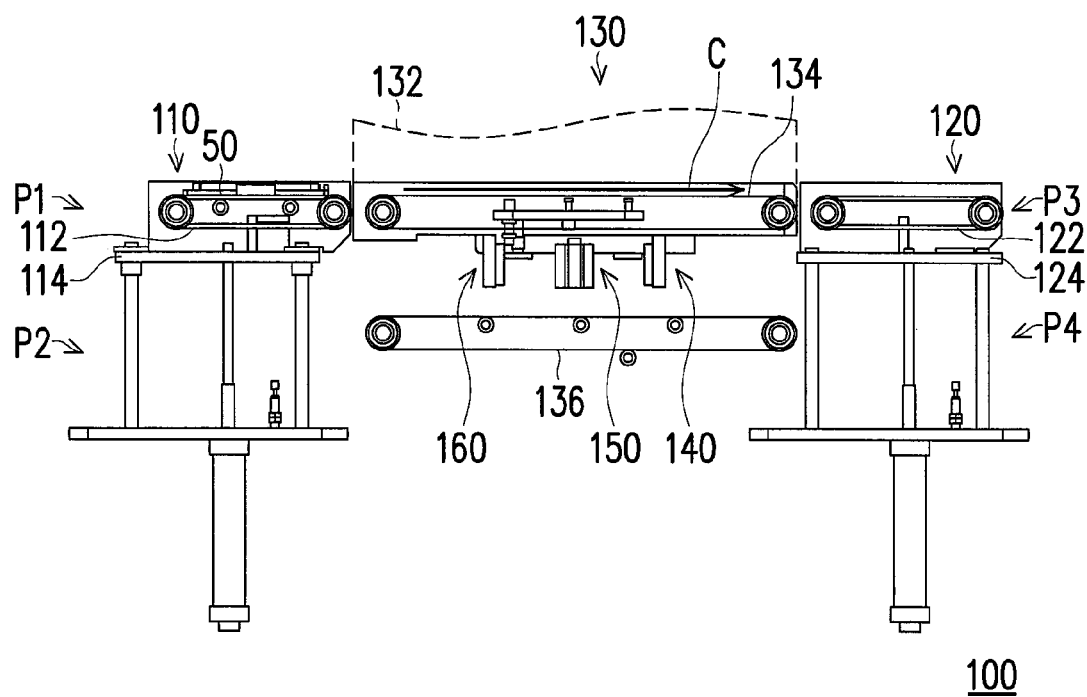
Figure 4:
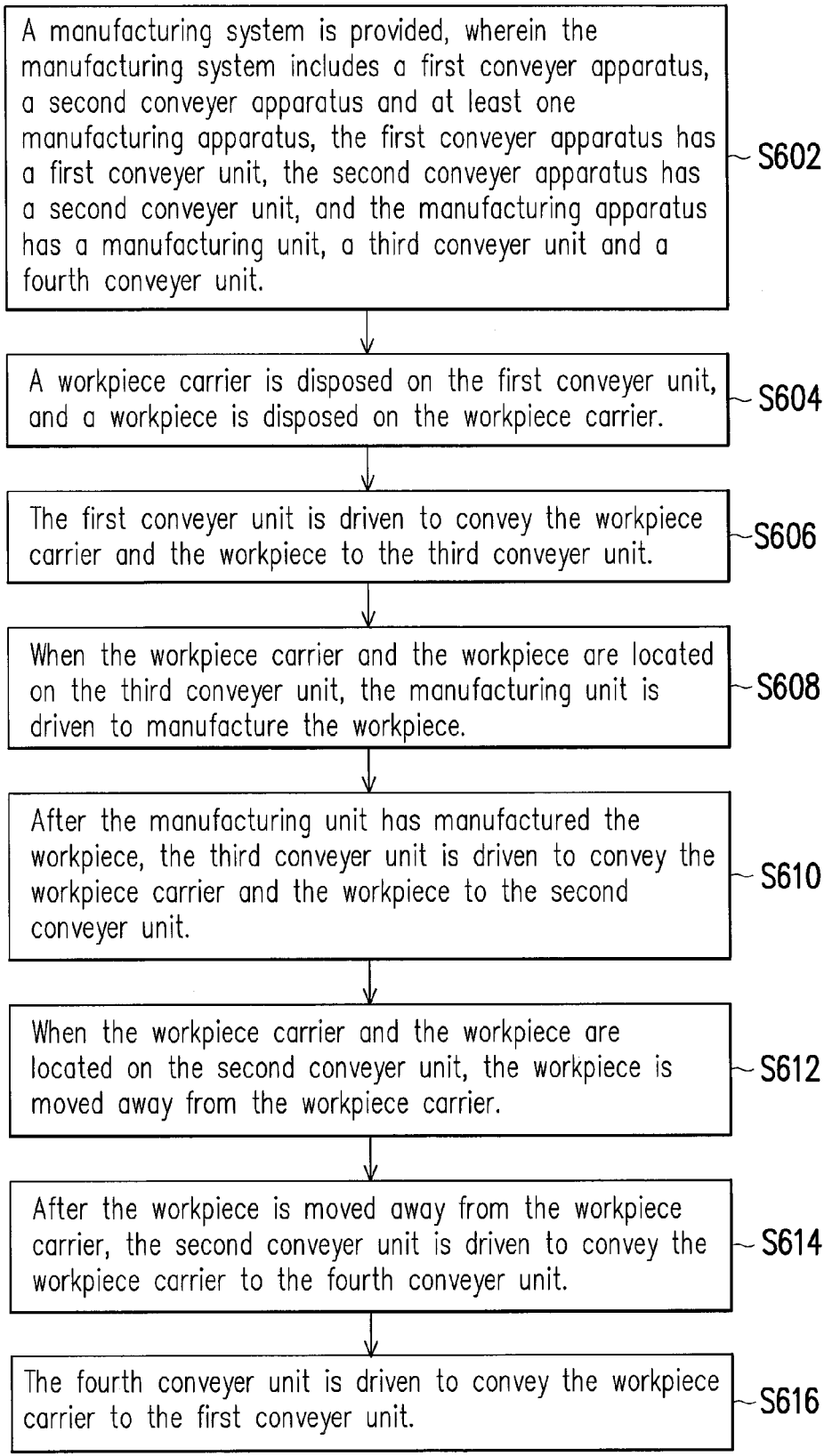
FIG. 4 is a flow chart illustrating a manufacturing method of the manufacturing system of FIG. 2.

Next, the fourth conveyer unit 136, as shown in FIG. 3G, is driven to convey the workpiece carrier 50 to the first conveyer unit 114 (step S616), and the first elevator unit 114 drives the first conveyer unit 112 to rise from the second position P2 depicted by FIG. 3G to the first position P1 depicted by FIG. 3H; now, the first conveyer unit 112 is aligned to the third conveyer unit 134, so that a user may dispose another workpiece waiting to be manufactured at the first conveyer unit 112 in order to continue with the manufacturing process as shown in FIG. 3A to FIG. 3H.

As described above, the first conveyer unit 112, the second conveyer unit 122, the third conveyer unit 134 and the fourth conveyer unit 136 of the present embodiment constitute a looping conveying path, so that the workpiece carrier 50 arrived at an end point (viz. the second conveyer unit 122 of the second conveyer apparatus 120) of a production line can automatically be sent back to a starting point (viz. the first conveyer unit 112 of the first conveyer apparatus 110) of the production line through the fourth conveyer unit 136 of the manufacturing apparatus 130. As a result, the user can enable the operation process to be continued without having to manually recover the workpiece carrier arrived at the ending point of the production line and manually provide the workpiece carrier to the starting point of the production line, such that manpower in need on the production line may be saved and thereby increases production efficiency. In addition, since the workpiece carrier 50 may constantly be looping in the production line, a quantity of the workpiece carrier 50 in demand may also be reduced, thereby lowering the production costs.

Figure 5:
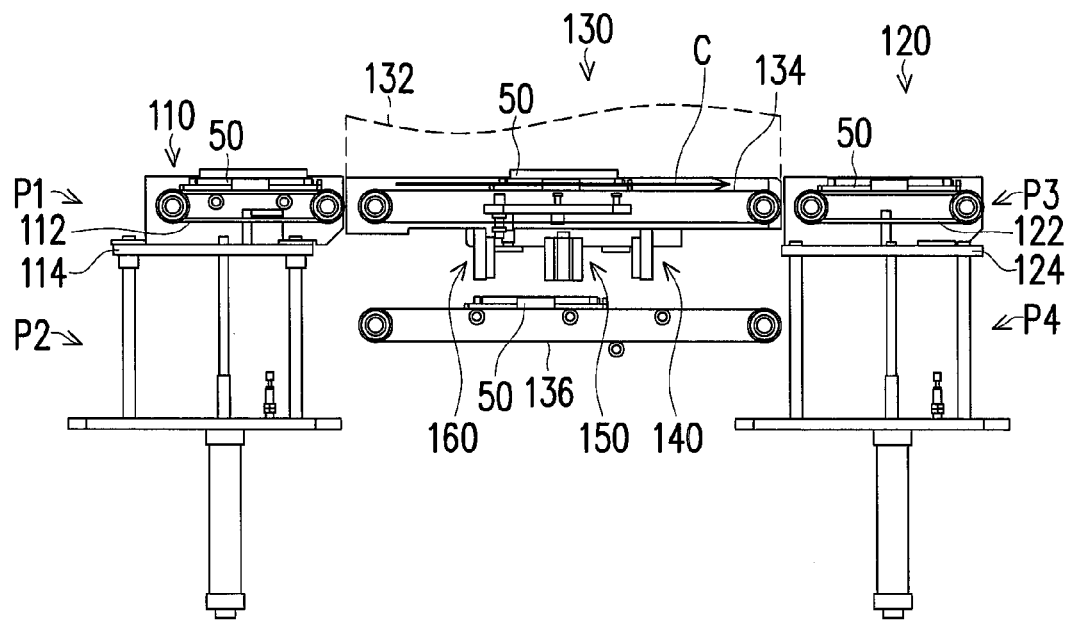
FIG. 5 is a schematic diagram illustrating the manufacturing system of FIG. 2 bearing a plurality of workpiece carriers.

In the operation process depicted by FIG. 3A to FIG. 3H, only one workpiece carrier 50 is looping in the production line of the manufacturing system 100, but the invention doest not intended to limit the quantity of the workpiece carrier bare by the manufacturing system 100, and this is further described along with drawing in the following. FIG. 5 is a schematic diagram illustrating the manufacturing system of FIG. 2 bearing a plurality of workpiece carriers. As shown in FIG. 5, the first conveyer unit 112, the second conveyer unit 122, the third conveyer unit 134 and the fourth conveyer unit 136 of the manufacturing system 100 may bear a plurality of workpiece carrier 50 (illustrated as four), such that the workpiece carriers 50 are simultaneously looping in the production line of the manufacturing system 100. In other embodiments, the workpiece carriers simultaneously looping in the production line of the manufacturing system 100 may be of other proper quantity, and t the invention is not limited thereto.

Referring to FIG. 2, the manufacturing system 100 of the present embodiment further includes a stopper unit 140 and a positioning unit 150, and the stopper unit 140 and the positioning unit 150 are both disposed at the manufacturing apparatus 130. In the aforementioned step S606, when the workpiece carrier 50, as shown in FIG. 3A, is moved onto the third conveyer unit 134 and arrived at a predetermined position, the stopper unit 140 may be driven into action to stop the workpiece carrier 50 from continue moving, and the positioning unit 150 may be driven into action to position the workpiece carrier 50, so that the manufacturing unit 134 can smoothly manufacture the workpiece 60 on the workpiece carrier 50. Accompanied with drawings, actuation means of the stopper unit 140 and the positioning unit 150 are specifically described in detail below.

Figure 6A:
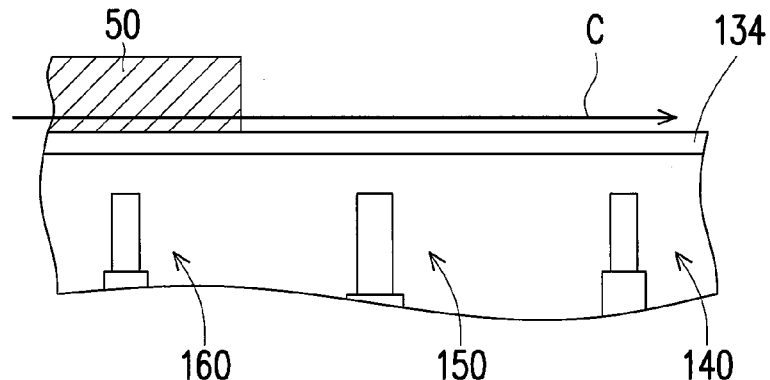
FIG. 6A and FIG. 6B are schematic diagrams illustrating actuation means of a stopper unit and a positioning unit of FIG. 2.
Figure 6B:
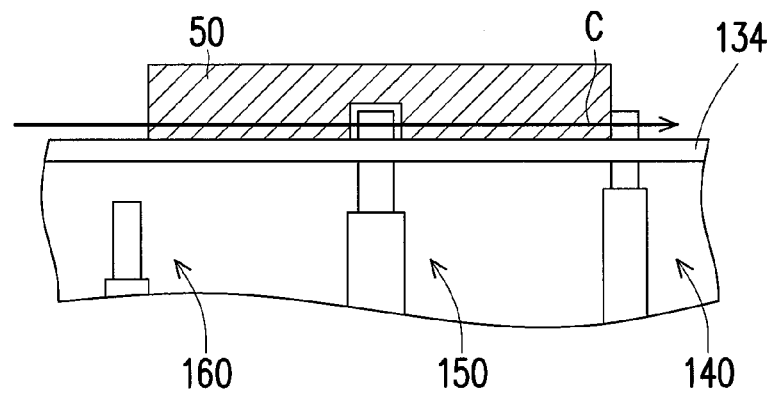
Figure 7:
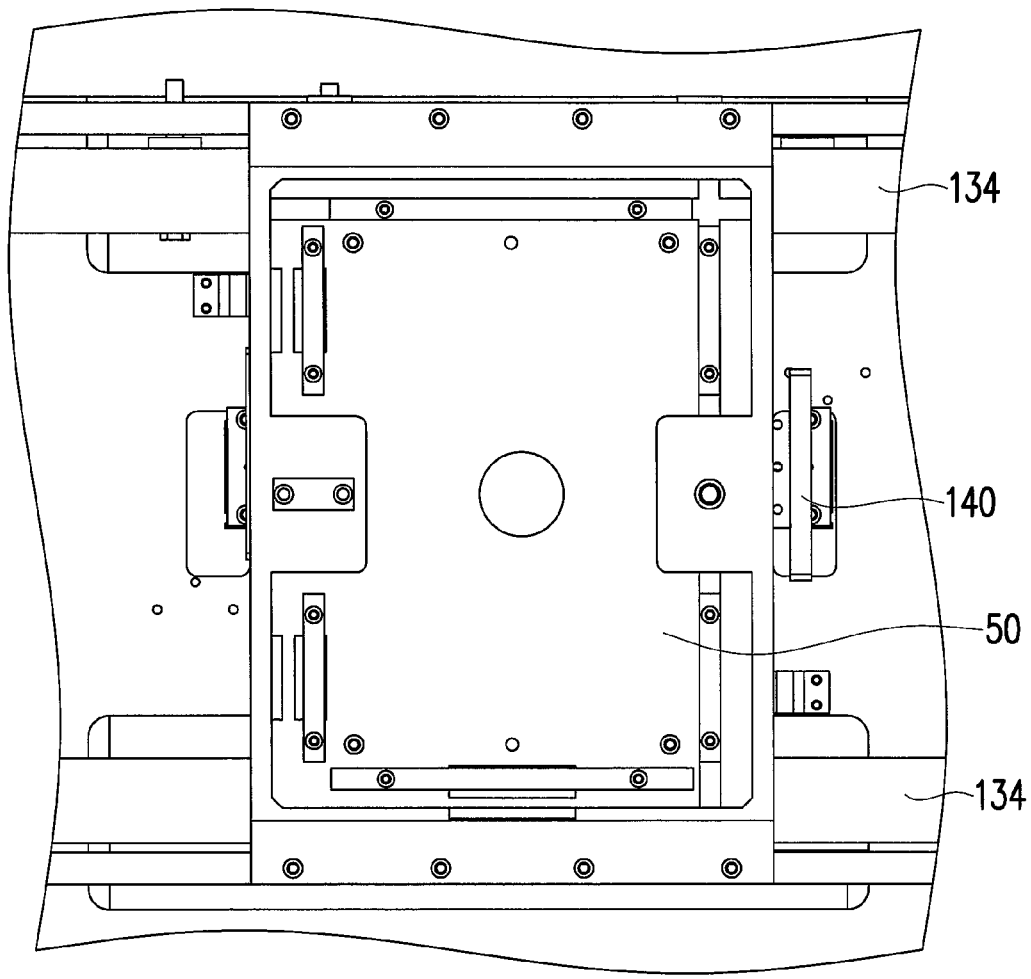
FIG. 7 is a partial top view of FIG. 3A.

FIG. 6A and FIG. 6B are schematic diagrams illustrating actuation means of a stopper unit and a positioning unit of FIG. 2. FIG. 7 is a partial top view of FIG. 3A. In order to have clearer drawings, the workpiece 60 in FIG. 3A is not illustrated in FIG. 6A, FIG. 6B and FIG. 7. When the workpiece carrier 50, as shown in FIG. 6A, is not yet arrived at the predetermined position on the third conveyer unit 134, the stopper unit 140 and the positioning unit 150 are not actuated. When the workpiece carrier 50, as shown in FIG. 6B, moves to the predetermined position on the third conveyer unit 134, the stopper unit 140, as shown in FIG. 6B and FIG. 7, protrudes to the conveying path C of the third conveyer unit 134 and stops the workpiece carrier 50 from continue moving, and the positioning unit 150 protrudes to the conveying path C of the third conveyer unit 134 and positions the workpiece carrier 50. In addition, the manufacturing system 100 of the present embodiment further includes a stopper unit 160, and when the manufacturing system 100 changes a direction of the production line to be opposite to the conveying path C depicted by FIG. 6A and FIG. 6B according to the needs, the stopper unit 140 may be stopped, and the stopper unit 160 may be used to stop the workpiece carrier 50; this is further described along with drawings in below.

Figure 8A:
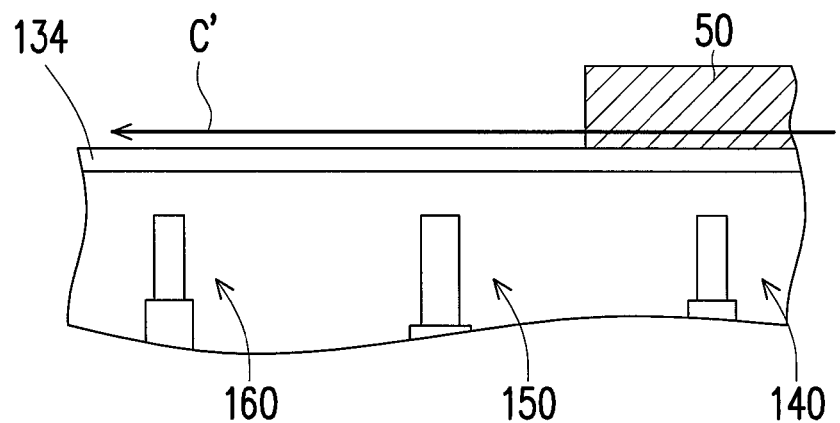
FIG. 8A and FIG. 8B are schematic diagrams illustrating actuation means of the stopper unit and the positioning unit of FIG. 2.
Figure 8B:
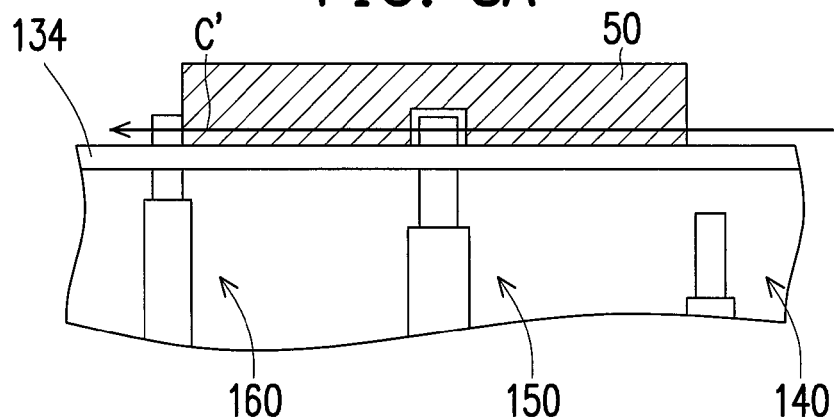

FIG. 8A and FIG. 8B are schematic diagrams illustrating actuation means of the stopper unit and the positioning unit of FIG. 2. In the embodiment illustrated by FIG. 8A and FIG. 8B, the direction of the production line of the manufacturing system 100 is a conveying path C', which is opposite to the conveying path C depicted by FIG. 6A and FIG. 6B. When the workpiece carrier 50, as shown in FIG. 8A, is not yet arrived at the on the predetermined position third conveyer unit 134, the stopper unit 160 and the positioning unit 150 are not actuated. When the workpiece carrier 50, as shown in FIG. 8B, moves to the predetermined position on the third conveyer unit 134, the stopper unit 160, as shown in FIG. 8B, protrudes to the conveying path C' of the third conveyer unit 134 and stops the workpiece carrier 50 from continue moving, and the positioning unit 150 protrudes to the conveying path C' of the third conveyer unit 134 and positions the workpiece carrier 50. In the present embodiment, the stopper unit 140 and the stopper unit 160, for example, are driven by the cylinder. In other embodiments, the manufacturing system may only be disposed with one of the stopper unit 140 and the stopper unit 160, or stop and position the workpiece carrier with other proper means, and the invention is not limited thereto.

Figure 9:
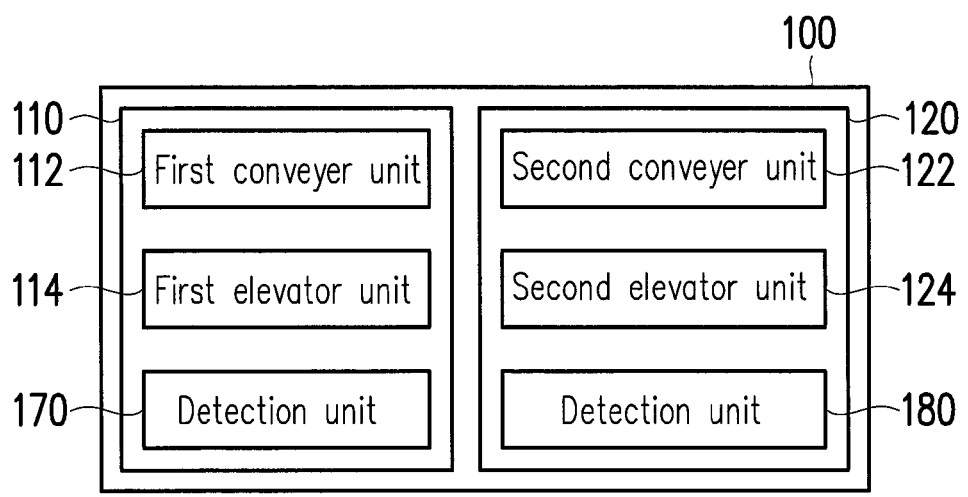
FIG. 9 is a schematic diagram illustrating partial components of the manufacturing system of FIG. 2.

In the manufacturing process shown in FIG. 4, actuation timings of the first elevator unit 114 and the second elevator unit 124, for example, are performed based on whether detections by detection units to the workpiece carrier 50 and the workpiece 60 are existed or not, and this is further described along with drawing in the following. FIG. 9 is a schematic diagram illustrating partial components of the manufacturing system of FIG. 2. Referring to FIG. 9, the manufacturing system 100 of the present embodiment further includes a detection unit 170 and a detection unit 180. The detection unit 170 is disposed at the first conveyer apparatus 110 and the detection unit 180 is disposed at the second conveyer apparatus 120.

When the aforementioned step S606 (the workpiece carrier 5 is moved from the first conveyer unit 112 to the third conveyer unit 134) is performed and the first conveyer unit 112 is still located at the first position P1, the detection unit 170 detects the workpiece carrier 50 not being located on the first conveyer unit 112 (the detection unit 170 may be a barrier sensor, a reflective sensor or any other type of sensor capable of sensing whether an object is existed or not); now, the manufacturing system 100 drives to the first elevator unit 114 to drive the first conveyer unit 112 to move from the first position P1 to the second position P2, and into a state shown in FIG. 3A, so that the first conveyer unit 112 is aligned to the fourth conveyer unit 136 and may be waiting to receive the workpiece carrier coming from the fourth conveyer unit 136.

When the aforementioned step S612 (the workpiece carrier 50 is moved onto the second conveyer unit 122 and moves the workpiece 60 away from the workpiece carrier 50) is performed and the second conveyer unit 122 is still located at the third position P3, the detection unit 180 detects the workpiece carrier 50 being located on the second conveyer unit 122 and not carrying the workpiece (the detection unit 180 may be a weight senor or any other type of sensor capable of identifying whether the workpiece is moved away from the workpiece carrier or not); now, the manufacturing system 100 drives the second elevator unit 124 to drive the second conveyer unit 122 to move from the third position P3 to the fourth position P4, and into a state shown in FIG. 3D, so that the second conveyer unit 122 is aligned to the fourth conveyer unit 136 and can convey the workpiece carrier 50 to the fourth conveyer unit 136, as shown in FIG. 3E.

After the workpiece carrier 50, as shown in FIG. 3E, is conveyed from the second conveyer unit 122 to the fourth conveyer unit 136, the detection unit 180 detects the workpiece carrier 50 not being located on the second conveyer unit 122 (the detection unit 180 may be the weight sensor or any other type of sensor capable of identifying whether the workpiece is moved away from the workpiece carrier or not, and may also includes a barrier sensor, a reflective sensor or any other type of sensor capable of sensing whether an object is existed or not); now, the manufacturing system 100 drives the second elevator unit 124 to drive the second conveyer unit 122 to move from the fourth position P4 to the third position P3, and into a states shown in FIG. 3F, so that the second conveyer unit 122 is aligned to the third conveyer unit 134 and may be waiting to receive the workpiece carrier coming from the third conveyer unit 134.

When the aforementioned step S616 is performed and the first conveyer unit 112 is still located at the second position P2, the detection unit 170 detects the workpiece carrier 50 being located on the first conveyer unit 112; now, the manufacturing system 100 drives the first elevator unit 114 to drive the first conveyer unit 112 to move from the second position P2 to the first position P1, so that the first conveyer unit 112 is aligned to the third conveyer unit 134, and thus the user is able to dispose another workpiece waiting to be manufactured at the first conveyer unit 112 for continuing the manufacturing process.

Referring to FIG. 1, the manufacturing unit 132 of the present embodiment, for example, has a display interface 132a, and the display interface 132a is adapted to display workpiece images captured by an image capture device inside of the manufacturing unit 132, so as to assist in calibrating a manufacturing accuracy. For example, the image capture device, for example, is a charge coupled device (CCD) camera and is adapted to capture images at a screw hole of the workpiece, so that the manufacturing unit 132, such as an automatic screw machine, can accurately perform a screw locking to the workpiece. In addition, the manufacturing unit 132, for example, has an alarm unit 132b, and the alarm unit 132b may respectively represents the manufacturing unit 132 being in normal operation, process abnormality or equipment malfunction with light signals of different colors. Moreover, if the manufacturing unit 132 is the automatic screw machine, as mentioned in above, then a screw locking information platform may further be installed at the manufacturing system 100 for respectively display abnormal locking/normal locking conditions of multiple screw locking points of the workpiece, so as to enhance efficiency in taking care of the process abnormality.

Figure 10:
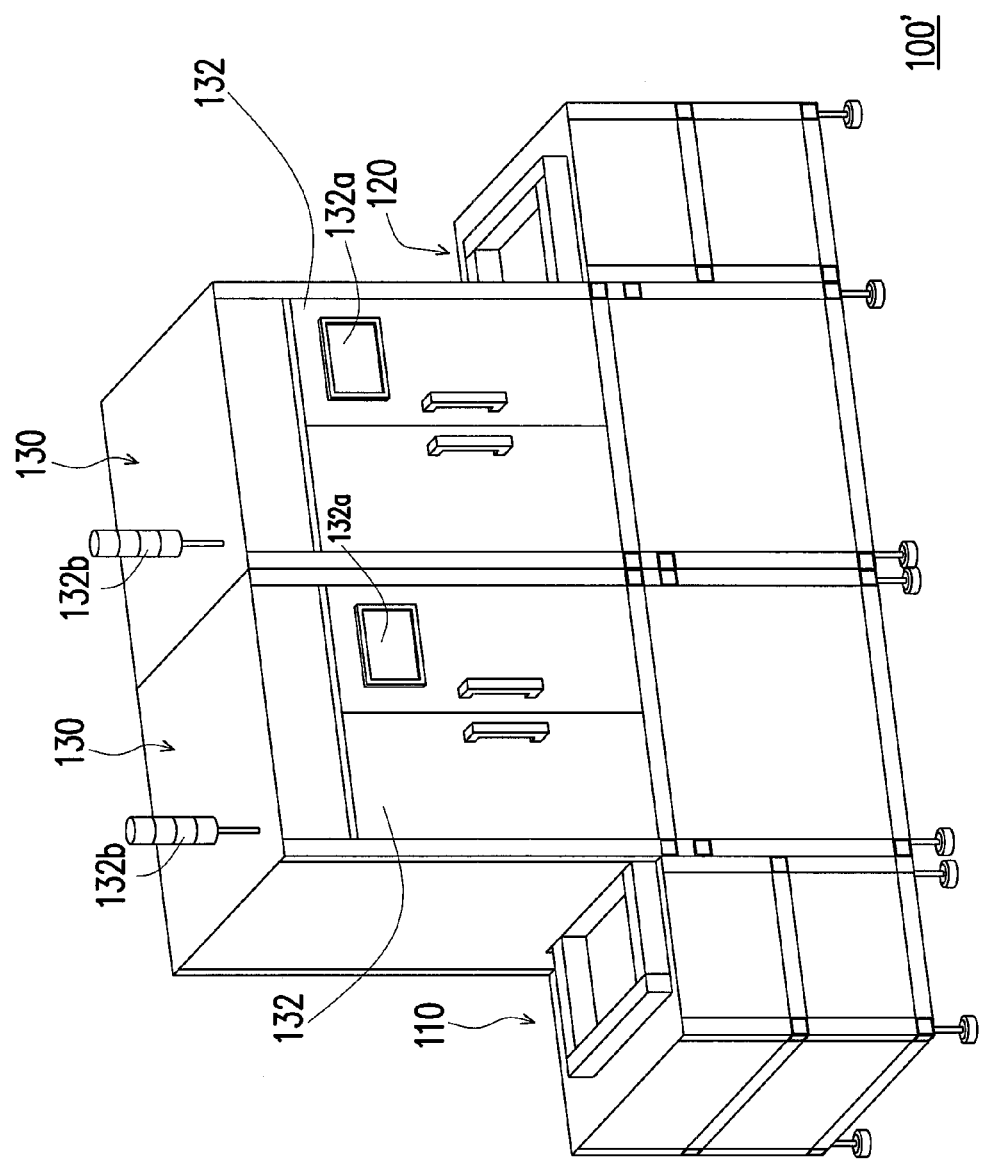
FIG. 10 is a perspective diagram illustrating a manufacturing system according to another embodiment of the invention.

In the embodiment illustrated in FIG. 1, the quaintly of the manufacturing apparatus 130 is one, but the invention is not limited thereto; and this is further described along with drawing in the following. FIG. 10 is a perspective diagram illustrating a manufacturing system according to another embodiment of the invention. In the embodiment illustrated in FIG. 10, the first conveyer apparatus 110 and the second conveyer apparatus 120 are disposed with two manufacturing apparatuses 130 therebetween, so that the manufacturing system 100' may perform a variety of manufacturing processes.

Figure 11:
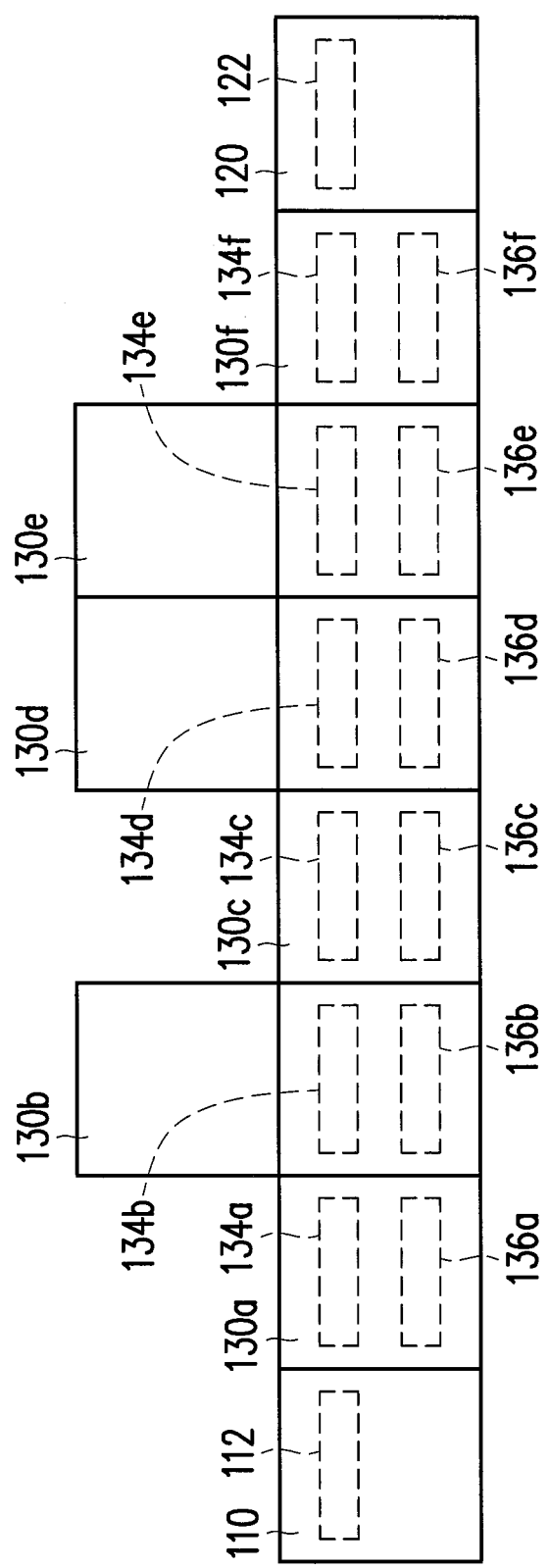
FIG. 11 is a schematic diagram illustrating a manufacturing system according to another embodiment of the invention.

FIG. 11 is a schematic diagram illustrating a manufacturing system according to another embodiment of the invention. Referring to FIG. 11, the first conveyer apparatus 110 and the second conveyer apparatus 120 of the manufacturing system 100" are disposed with a plurality of manufacturing apparatuses 130a to 130f therebetween. In the embodiment illustrated in FIG. 11, the manufacturing apparatus 130a, the manufacturing apparatus 130c and the manufacturing apparatus 130f, for example, are manual operation platforms, the manufacturing apparatus 130b, the manufacturing apparatus 130d and the manufacturing apparatus 130e, for example, are automation machines, and the manufacturing apparatuses, through being connected in series, are combined to form a production line. Similar to the manufacturing apparatus 130 depicted by FIG. 2 that has the third conveyer unit 134 and the fourth conveyer unit 136, and the looping conveying path constituted of the first conveyer unit 112, the second conveyer unit 122, the third conveyer unit 134 and the fourth conveyer unit 136, the manufacturing apparatuses 130a to 130f of the present embodiment respectively have third conveyer units 134a to 134f and respectively have fourth conveyer units 136a to 136f. The third conveyer units 134a to 134f are adjacently arranged in sequence, and the fourth conveyer units 136a to 136f are adjacently arranged in sequence, so that a looping conveying path constituted of the first conveyer unit 112, the second conveyer unit 122, the third conveyer units 134a to 134f and the fourth conveyer units 136a to 136f enables the workpiece to smoothly perform the manufacturing at this production line, and enable the workpiece carrier to be reused through the aforementioned looping conveying path.

Furthermore, the manufacturing apparatuses 130a to 130f are adapted to sequentially perform different types of manufacturing to the workpiece, and the manufacturing apparatuses 130a to 130f may simultaneously manufacture the plurality of workpeices on the production line of the manufacturing system 100, respectively. If manufacturing time lengths of the manufacturing apparatuses 130a to 130f are different from each other, then the manufacturing system 100" may be set as to drive the conveyer units to action only after all the manufacturing apparatuses 130a to 130f are completed with the manufacturing, so that the manufacturing process can be smoothly performed. In addition, each manufacturing unit shown in FIG. 11 may be seen as a manufacturing module, and in other embodiments, the quantity of each manufacturing module may be increased or decreased or an arrangement means of the manufacturing modules may be adjusted according to the process needs, so as to attain various types of manufacturing process. Moreover, the direction of the production line may easily be adjusted to the opposite direction via changing the aforementioned the convey direction of the conveyer units, so as to cope with the need in the process.

In summary, in the invention, the manufacturing apparatus is disposed between the first conveyer apparatus and the second conveyer apparatus, the first conveyer apparatus has the first elevator unit adapted to drive the first conveyer unit, and the second conveyer apparatus has the second elevator unit adapted to drive the second conveyer unit. With this, when the first conveyer unit of the first conveyer apparatus is driven by the first elevator unit to be aligned to the third conveyer unit of the manufacturing apparatus, the first conveyer unit may convey the workpiece waiting to be manufactured and the workpiece carrier carrying the workpiece to the third conveyer unit, so that the manufacturing unit corresponding to the third conveyer unit can manufacture the workpiece. When the second conveyer unit of the second conveyer apparatus is driven by the second elevator unit to be aligned to the third conveyer unit of the manufacturing apparatus, the third conveyer unit may convey the manufactured workpiece and the workpiece carrier carrying the workpiece to the second conveyer unit, so as to facilitate the user to remove the manufactured workpiece. Next, when the second conveyer unit of the second conveyer apparatus is driven by the second elevator unit to be aligned to the fourth conveyer unit of the manufacturing apparatus, the second conveyer unit may convey the workpiece carrier not carrying the workpiece to the fourth conveyer unit. When the first conveyer unit of the first conveyer apparatus is driven by the first elevator unit to be aligned to the fourth conveyer unit of the manufacturing apparatus, the fourth conveyer unit may convey the workpiece carrier not carrying the workpiece to the first conveyer unit. When the first conveyer unit of the first conveyer apparatus is again driven by the first elevator unit to be aligned to the third conveyer unit of the manufacturing apparatus, the user may dispose another workpiece waiting to be manufactured on the first conveyer unit and continue to perform the manufacturing process. According to the above, the first conveyer unit, the second conveyer unit, the third conveyer unit and the fourth conveyer unit of the invention constitute a looping conveying path, so that the workpiece carrier arrived at the ending point (viz., the second conveyer unit of the second conveyer apparatus) of the production line can automatically be sent back to the starting point (viz., the first conveyer unit of the first conveyer apparatus) of the production line through the fourth conveyer unit of the manufacturing apparatus. As a result, the user can enable the operation process to be continued without having to manually recover the workpiece carrier arrived at the ending point of the production line and manually provide the workpiece carrier to the starting point of the production line, such that manpower in need on the production line may be saved and thereby increases the production efficiency. In addition, since the workpiece carrier may constantly be looping in the production line, the quantity of the workpiece carrier in demand may also be reduced, thereby lowering the production costs.

It will be apparent to those skilled in the art that various modifications and variations can be made to the structure of the application without departing from the scope or spirit of the application. In view of the foregoing, it is intended that the application cover modifications and variations of this application provided they fall within the scope of the following claims and their equivalents.

What is claimed is:

1. A manufacturing system comprising:
a first conveyer apparatus having a first conveyer unit and a first elevator unit, wherein the first elevator unit is adapted to drive the first conveyer unit to move upward or downward between a first position and a second position;
a second conveyer apparatus having a second conveyer unit and a second elevator unit, wherein the second elevator unit is adapted to drive the second conveyer unit to move upward or downward between a third position and a fourth position;
at least one manufacturing apparatus disposed between the first conveyer apparatus and the second conveyer apparatus and having a manufacturing unit, a third conveyer unit and a fourth conveyer unit, wherein a conveying path of the third conveyer unit passes through the manufacturing unit, the first position and the third position are aligned to the third conveyer unit, and the second position and the fourth position are aligned to the fourth conveyer unit,
wherein when the first conveyer unit is located at the first position, the first conveyer unit is adapted to convey a workpiece carrier to the third conveyer unit, when the second conveyer unit is located at the third position, the third conveyer unit is adapted to convey the workpiece carrier to the second conveyer unit, when the second conveyer unit is located at the fourth position, the second conveyer unit is adapted to convey the workpiece carrier to the fourth conveyer unit, and when the first conveyer unit is located at the second position, the fourth conveyer unit is adapted to convey the workpiece carrier to the first conveyer unit; and
a detection unit disposed at the first conveyer apparatus or the second conveyer apparatus for detecting the workpiece carrier.

2. The manufacturing system as recited in claim 1, wherein a quantity of the at least one manufacturing apparatus is a plurality and the manufacturing apparatuses are adjacently arranged, such that the third conveyer units are adjacently arranged in sequence, and the fourth conveyer units are adjacently arranged in sequence, correspondingly.

3. The manufacturing system as recited in claim 1, wherein the manufacturing apparatus is one of an automation machine and a manual operation platform.

4. The manufacturing system as recited in claim 1 further comprising a stopper unit disposed at the manufacturing apparatus, wherein when the workpiece carrier moves to a predetermined position on the third conveyer unit, the stopper unit interferes with the conveying path of the third conveyer unit and stops the workpiece carrier from continue moving.

5. The manufacturing system as recited in claim 1 further comprising a positioning unit disposed at the manufacturing apparatus, wherein when the workpiece carrier moves to a predetermined position on the third conveyer unit, the positioning unit interferes with the conveying path of the third conveyer unit and positions the workpiece carrier.

6. The manufacturing system as recited in claim 1, wherein when the first conveyer unit is located at the first position and the detection unit detects the workpiece carrier not being located on the first conveyer unit, the first elevator unit drives the first conveyer unit to move from the first position to the second position, and when the first conveyer unit is located at the second position and the detection unit detects the workpiece carrier being located on the first conveyer unit, the first elevator unit drives the first conveyer unit to move from the second position to the first position.

7. The manufacturing system as recited in claim 1, wherein the workpiece carrier is adapted to carry a workpiece, when the second conveyer unit is located at the third position and the detection unit detects the workpiece carrier being located on the second conveyer unit and not carrying the workpiece, the second elevator unit drives the second conveyer unit to move from the third position to the fourth position, and when the second conveyer unit is located at the fourth position and the detection unit detects the workpiece carrier not being located on the second conveyer unit, the second elevator unit drives the second conveyer unit to move from the fourth position to the third position.

8. A manufacturing method comprising:
   providing a manufacturing system, wherein the manufacturing system comprises a first conveyer apparatus, a second conveyer apparatus, a detection unit and at least one manufacturing apparatus, the detection unit is disposed at the first conveyer apparatus or the second conveyer apparatus, the manufacturing apparatus is disposed between the first conveyer apparatus and the second conveyer apparatus and adjacent to the first conveyer apparatus and the second conveyer apparatus, wherein the first conveyer apparatus has a first conveyer unit, the second conveyer apparatus has a second conveyer unit, the manufacturing apparatus has a manufacturing unit, a third conveyer unit and a fourth conveyer unit;
   disposing a workpiece carrier on the first conveyer unit, and disposing a workpiece on the workpiece carrier;
   detecting a position of the workpiece carrier through the detection unit;
   driving the first conveyer unit to convey the workpiece carrier and the workpiece to the third conveyer unit;
   manufacturing the workpiece when the workpiece carrier and the workpiece are located on the third conveyer unit;
   driving the third conveyer unit to convey the workpiece carrier and the workpiece to the second conveyer unit after the workpiece is manufactured;
   moving the workpiece away from the workpiece carrier when the workpiece carrier and the workpiece are located on the second conveyer unit;
   driving the second conveyer unit to convey the workpiece carrier to the fourth conveyer unit after the workpiece is moved away from the workpiece carrier; and
   driving the fourth conveyer unit to convey the workpiece carrier to the first conveyer unit.

9. The manufacturing method as recited in claim 8 further comprising:
   driving a first elevator unit to drive the first conveyer unit to move upward or downward between a first position and a second position, wherein when the first conveyer unit is located at the first position, the first conveyer unit is aligned to the third conveyer unit, and when the first conveyer unit is located at the second position, the first conveyer unit is aligned to the fourth conveyer unit.

10. The manufacturing method as recited in claim 9 further comprising:
    detecting whether the workpiece carrier is located on the first conveyer unit through the detection unit when the first conveyer unit is located at the first position; and
    if the detection unit detects the workpiece carrier not being located on the first conveyer unit, then driving the first elevator unit to drive the first conveyer unit to move from the first position to the second position.

11. The manufacturing method as recited in claim 9 further comprising:
    detecting whether the workpiece carrier is located on the first conveyer unit through the detection unit when the first conveyer unit is located at the second position; and
    if the detection unit detects the workpiece carrier being located on the first conveyer unit, then driving the first elevator unit to drive the first conveyer unit to move from the second position to the first position.

12. The manufacturing method as recited in claim 8 further comprising:
    driving a second elevator unit to drive the second conveyer unit to move upward or downward between a third position and a fourth position, wherein when the second conveyer unit is located at the third position, the second conveyer unit is aligned to the third conveyer unit, and when the second conveyer unit is located at the fourth position, the second conveyer unit is aligned to the fourth conveyer unit.

13. The manufacturing method as recited in claim 12 further comprising:
    detecting whether the workpiece carrier is located on the second conveyer unit and whether the workpiece carrier is carrying the workpiece through the detection unit when the second conveyer unit is located at the third position; and
    if the detection unit detects the workpiece carrier being located on the second conveyer unit and not carrying the workpiece, then driving the second elevator unit to drive the second conveyer unit to move from the third position to the fourth position.

14. The manufacturing method as recited in claim 12 further comprising:
    detecting whether the workpiece carrier is located on the second conveyer unit through the detection unit when the second conveyer unit is located at the fourth position; and
    if the detection unit detects the workpiece carrier not being located on the second conveyer unit, then driving the second elevator unit to drive the second conveyer unit to move from the fourth position to the third position.

15. The manufacturing method as recited in claim 8 further comprising:
    driving a stopper unit to interfere with a conveying path of the third conveyer unit to stop the workpiece carrier from continue moving when the workpiece carrier moves to a predetermined position on the third conveyer unit.

16. The manufacturing method as recited in claim 8 further comprising:
    driving a positioning unit to interfere with a conveying path of the third conveyer unit to position the workpiece carrier when the workpiece carrier moves to a predetermined position on the third conveyer unit.

* * * * *